(12) United States Patent
Mallik et al.

(10) Patent No.: US 11,387,175 B2
(45) Date of Patent: Jul. 12, 2022

(54) INTERPOSER PACKAGE-ON-PACKAGE (POP) WITH SOLDER ARRAY THERMAL CONTACTS

(71) Applicant: Intel Corporation, Santa Clara, CA (US)

(72) Inventors: Debendra Mallik, Chandler, AZ (US); Sanka Ganesan, Chandler, AZ (US); Pilin Liu, Chandler, AZ (US); Shawna Liff, Scottsdale, AZ (US); Sri Chaitra Chavali, Chandler, AZ (US); Sandeep Gaan, Phoenix, AZ (US); Jimin Yao, Chandler, AZ (US); Aastha Uppal, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 16/059,535

(22) Filed: Aug. 9, 2018

(65) Prior Publication Data

US 2020/0051899 A1    Feb. 13, 2020

(51) Int. Cl.
| | | |
|---|---|---|
| *H01L 23/28* | (2006.01) | |
| *H01L 23/34* | (2006.01) | |
| *H01L 23/538* | (2006.01) | |
| *H01L 23/532* | (2006.01) | |
| *H01L 23/498* | (2006.01) | |

(52) U.S. Cl.
CPC ........ *H01L 23/49816* (2013.01); *H01L 23/28* (2013.01); *H01L 23/34* (2013.01); *H01L 23/5384* (2013.01); *H01L 23/53228* (2013.01); *H01L 23/53257* (2013.01)

(58) Field of Classification Search
CPC ... H01L 23/49816; H01L 23/28; H01L 23/34; H01L 23/53228; H01L 23/53257; H01L 23/5384

See application file for complete search history.

(56) References Cited

U.S. PATENT DOCUMENTS

| | | | |
|---|---|---|---|
| 2011/0176280 A1* | 7/2011 | Lee | H01L 23/3677 361/721 |
| 2013/0082372 A1* | 4/2013 | Lin | H01L 25/105 257/686 |
| 2014/0374902 A1* | 12/2014 | Lee | H01L 25/105 257/738 |
| 2019/0139896 A1* | 5/2019 | Hsu | H01L 23/3114 |
| 2020/0194331 A1* | 6/2020 | Kim | H01L 24/13 |

* cited by examiner

*Primary Examiner* — Peniel M Gumedzoe
(74) *Attorney, Agent, or Firm* — Schwabe, Williamson & Wyatt, P.C.

(57) ABSTRACT

Embodiments include an electronics package and methods of forming such packages. In an embodiment, the electronics package comprises a first package substrate. In an embodiment, the first package substrate comprises, a die embedded in a mold layer, a thermal interface pad over a surface of the die, and a plurality of solder balls over the thermal interface pad. In an embodiment, the thermal interface pad and the solder balls are electrically isolated from circuitry of the electronics package. In an embodiment, the electronics package further comprises a second package substrate over the first package substrate.

16 Claims, 10 Drawing Sheets

INTERPOSER PACKAGE-ON-PACKAGE (POP) WITH SOLDER ARRAY THERMAL CONTACTS

TECHNICAL FIELD

Embodiments of the present disclosure relate to electronics packaging, and more particularly, interposer package-on-package (PoP) architectures with thermal contacts.

BACKGROUND

Package-on-package (PoP) assemblies that include an interposer typically include a polymer material to fill the air gap between the die backside and the interposer. However, the polymer materials have a low thermal conductivity, even when filler particles are used. Accordingly, such packages have poor thermal performance. The poor thermal performance due to limited heat dissipation limits the performance of the packaged dies.

EMBODIMENTS OF THE PRESENT DISCLOSURE

Described herein are electronics packages with interposer package-on-package (PoP) architectures with thermal contacts. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, interposer PoP architectures are limited by poor thermal performance. Accordingly, embodiments described herein include interposer PoP architectures with improved thermal performance enabled by a thermal pad and solder balls coupled to the backside surface of a packaged die. Thermal performance is improved since the thermal pad and solder balls have significantly higher thermal conductivity compared to polymer materials currently used. Furthermore, embodiments include forming an underfill material around the solder balls in order to minimize the spread of solder during various process operations such as second level interconnect (SLI) attach, board assembly reflow, and temperature cycling during operation of the device.

Additionally, embodiments described herein provide additional advantages beyond improved thermal performance. Particularly, the use of solder and underfill material above the die (for thermal regulation) helps to balance the material composition of the package. For example, similar materials (i.e., solder and underfill) may be used below the die to enable flip-chip mounting. Accordingly, embodiments described herein also minimize warpage of the package and therefore, improves PoP board assembly. Such a balanced structure lends to ease of customer board assembly and finer pitch (which enables a smaller package) for both the bottom and the top packages.

Figure 1A:
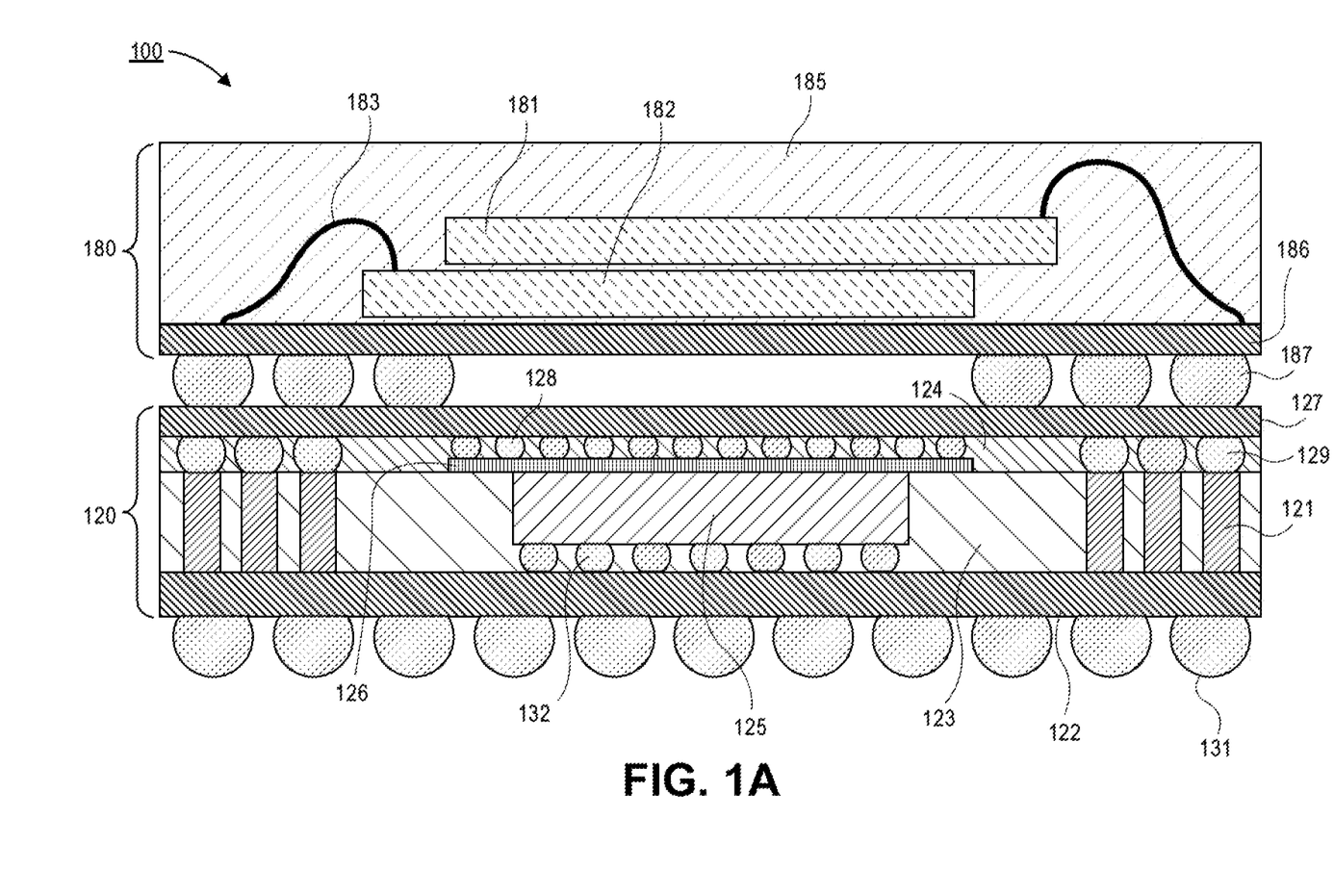
FIG. 1A is a cross-sectional illustration of an interposer package-on-package (PoP) assembly that includes a thermal pad and solder bumps over the backside surface of the first die, in accordance with an embodiment.

Referring now to FIG. 1A, a cross-sectional illustration of an interposer PoP assembly 100 is shown in accordance with an embodiment. In an embodiment, the interposer PoP assembly 100 may comprise a first package 120 and a second package 180 attached over the first package 120. In an embodiment, the first package 120 may comprise a first die 125 that is embedded within a mold layer 123. In an embodiment, a backside surface of the first die 125 may be substantially coplanar with a surface of the mold layer 123. As used herein substantially coplanar may refer to surfaces that are within 5 μm of being coplanar.

In an embodiment, a thermal pad 126 may be formed over the backside surface of the first die 125. In an embodiment, the thermal pad 126 may also be formed over portions of the mold layer 123. In an embodiment, the thermal pad 126 may be a material that has a high thermal conductivity. In an embodiment, the thermal pad 126 is a metallic material. For example, the thermal pad 126 may be comprise titanium, copper, alloys of titanium and copper, or any other conductive materials. In an embodiment, the thermal pad 126 may be have a thickness of 50 nm, or greater, 25 μm or greater, 50 μm or greater, or 100 μm or greater. In an embodiment, the thermal pad 126 may be electrically isolated from other circuitry in the PoP assembly 100. That is, in some embodiments, thermal pad 126 may not be used to carry signals used by the active dies of the PoP assembly 100. In an additional embodiment, thermal pad 126 may be electrically coupled to a voltage level of the PoP assembly 100. In a particular embodiment, the thermal pad 126 may be held at a voltage level of the backside of the first die 125.

In an embodiment, a plurality of solder balls 128 may be positioned over and contact the thermal pad 126. In an embodiment, the plurality of solder balls 128 may be any suitable solder material with a high thermal conductivity. In a particular embodiment, the solder balls 128 may be the same solder 132 used to flip-chip mount the first die 125 to the package substrate 122. Using the same solder above and below the first die 125 may help mitigate die warpage since the structure is more balanced. In an embodiment, the plurality of solder balls 128 may be electrically isolated from other circuitry in the PoP assembly.

In an embodiment, the plurality of solder balls 128 may also contact the interposer 127 positioned over the first die 125. As such, the thermal pad 126 and the solder balls 128 may thermally couple the first die 125 to the interposer 127. Since the thermal path between the interposer 127 and the first die 125 is formed by materials with high thermal conductivity, more heat may be dissipated compared to prior solutions described above that use a polymer to fill the gap between the interposer 127 and the first die 125.

The improved heat dissipation also allows for the thermal energy to be dissipated in a more uniform profile. As such, the presence of localized hot spots is minimized. By extending the thermal pad 126 beyond the edges of the first die 125, as shown in FIG. 1A, the thermal energy may be dissipated to a larger area, and the thermal profile is improved.

In an embodiment, the solder balls 128 may be surrounded by an underfill material 124. The use of an underfill material minimizes the chances of the solder balls 128 being extruded, squeezed-out, pumped-out etc. during subsequent processing operations or during operation. In an embodiment, the underfill material 124 may be a distinct material from the mold layer 123. In an additional embodiment, the underfill material 124 may be the same material as the mold layer 123.

In an embodiment, the interposer PoP assembly 100 may also comprise other features typical of PoP assemblies. For example, the mold layer 123 may be formed over a package substrate 122. For example, the package substrate 122 may be a redistribution layer or the like and include traces, vias, and/or pads (not shown) that electrically couples second level interconnects (SLIs) such as ball grid array (BGA) balls 131 to solder balls 132. In an embodiment, the interposer PoP assembly 100 may also comprise through mold interconnects (TMIs). For example, the TMIs may comprise conductive pillars 121. In an embodiment, the conductive pillars 121 may be electrically coupled to the interposer 127 by solder 129.

In an embodiment, solder 129 may be electrically coupled to solder bumps 187 by conductive routing (e.g., traces, vias, and/or pads (not shown)) in the interposer 127. In an embodiment, the solder bumps 187 may electrically couple the interposer 127 to the second package 180. In an embodiment, the second package 180 may comprise a package substrate 186, such as a redistribution layer, and a second mold layer 185 over the package substrate 186. In an embodiment one or more dies (e.g., dies 181 and 182) may be embedded within the second mold layer 185. In an embodiment, the dies 181 and 182 may be wire bonded with wires 183 to the package substrate 186. However, the dies may also be coupled to the second package substrate 186 with other interconnects, such as flip chip bonding or the like. In a particular embodiment, the first die 125 in the first package 120 may be a processor and the one or more dies 181, 182 in the second package 180 may be memory components, or other peripheral component dies (e.g., RF, power management, etc.).

Figure 1B:
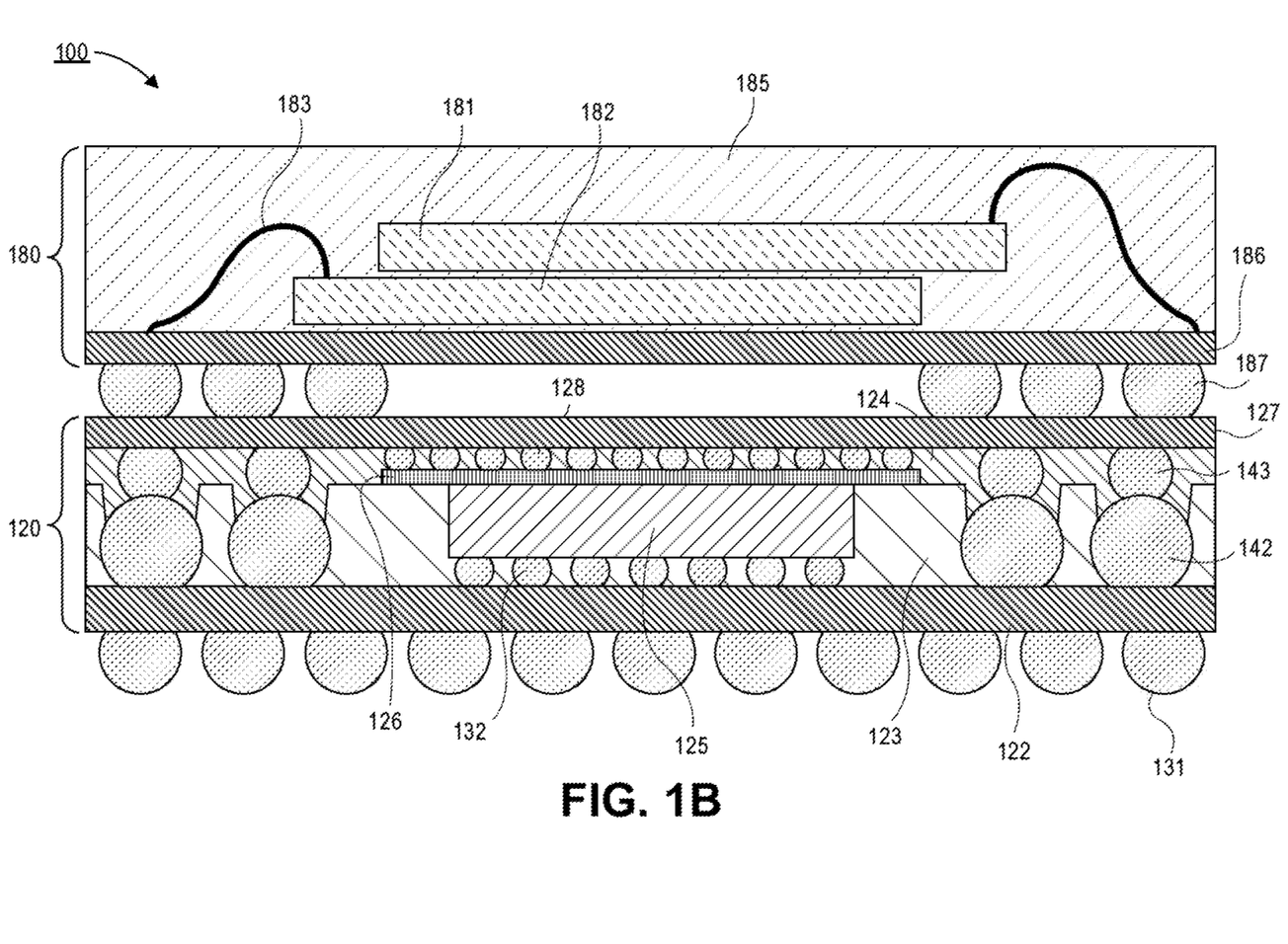
FIG. 1B is a cross-sectional illustration of an interposer PoP assembly that includes a thermal pad and solder balls over the backside surface of the first die, in accordance with an additional embodiment.

It is to be appreciated that the structure of the interposer PoP assembly 100 is not limited to the illustrated components of FIG. 1A. For example, embodiments may include additional features, and/or substitutions of components known to those skilled in the art. For example, as shown in FIG. 1B, the TMIs are not limited to conductive pillars. In an additional embodiments, the TMIs may include solder balls 142 and 143. In an embodiment, the solder balls 142 may be entirely solder. In an alternative embodiment, the solder balls 142 may have a core material (e.g., a copper core). While solder balls and conductive pillars are described, it is to be appreciated that embodiments may include any other TMI, such as solder pastes, combinations of different TMI architectures, or the like.

Figure 1C:
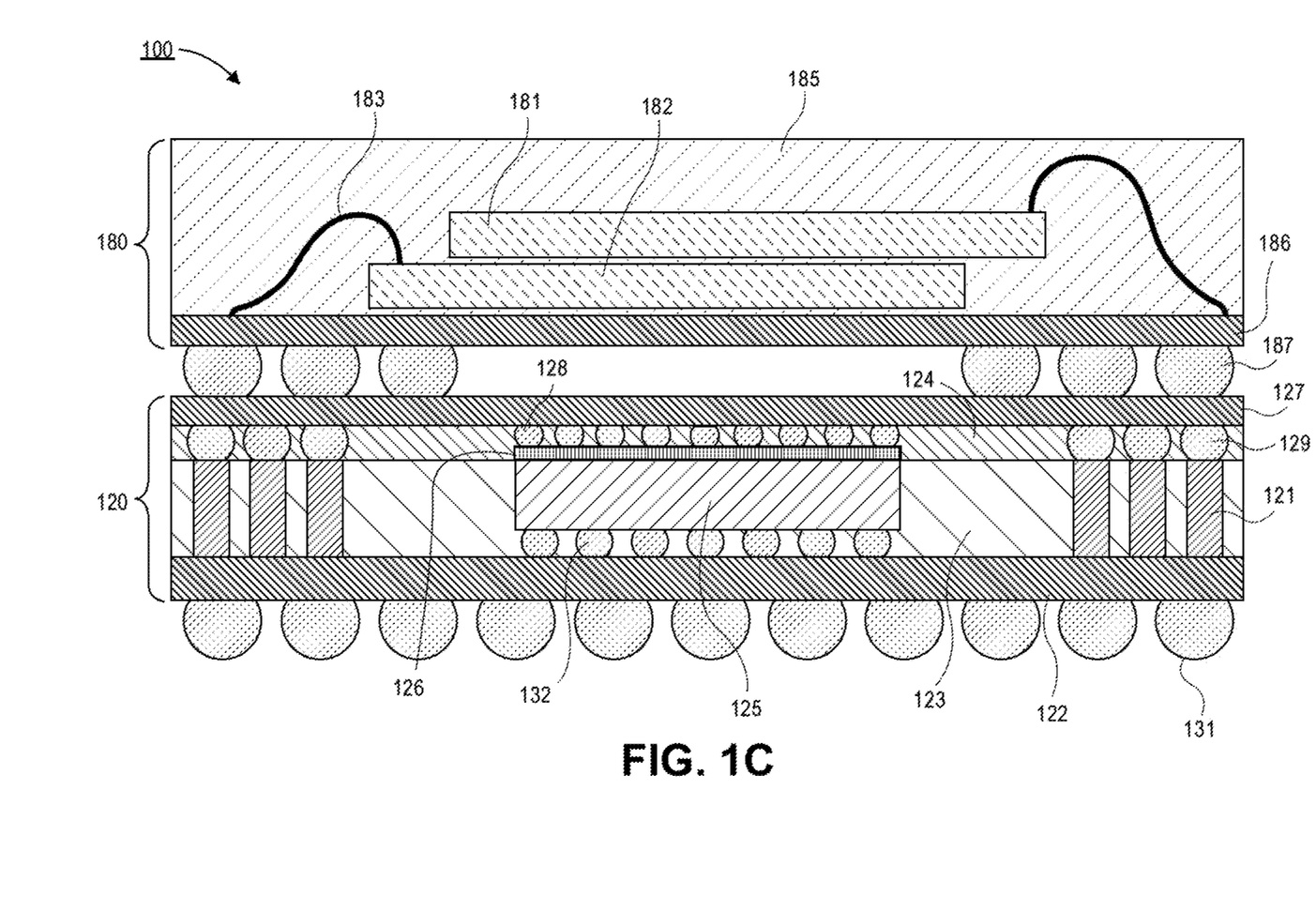
FIG. 1C is a cross-sectional illustration of an interposer PoP assembly that includes a thermal pad and solder balls that are only over the backside surface of the first die, in accordance with an embodiment.

Referring now to FIG. 1C, a cross-sectional illustration of an interposer PoP assembly 100 is shown in accordance with an additional embodiment. In an embodiment, the interposer PoP assembly 100 may be substantially similar to the PoP assembly 100 described with respect to FIG. 1A, with the exception that the thermal pad 126 is formed only over a backside surface of the first die 125. Such an embodiment may be utilized when the thermal pad 126 is disposed over the first die 125 at the wafer level (i.e., before the first die 125 is attached to the package substrate 122). However, it is to be appreciated that embodiments may also include a thermal pad 126 that is formed only over the first die 125 using other process flows.

Figure 1D:
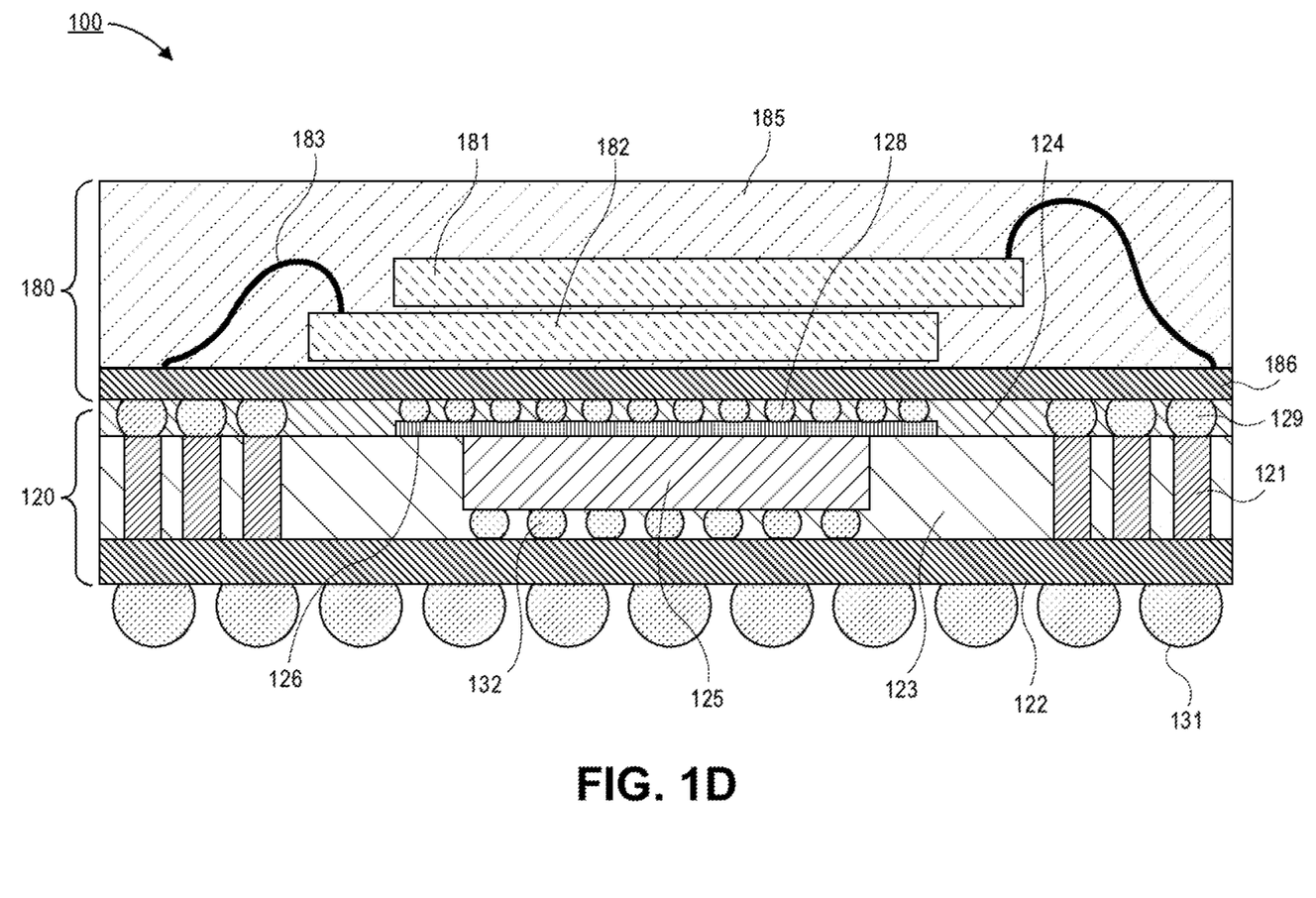
FIG. 1D is a cross-sectional illustration of a PoP assembly that includes a thermal pad and solder balls over the backside surface of the first die, in accordance with an embodiment.

Referring now to FIG. 1D, a cross-sectional illustration of a PoP assembly 100 is shown in accordance with an additional embodiment. The PoP assembly 100 in FIG. 1D is substantially similar to the interposer PoP assembly 100 described in FIG. 1A, with the exception that the interposer 127 is omitted. In such an embodiment, the solder balls 128 may contact the second package substrate 186. Accordingly, the first die 125 may be thermally coupled to the second package 180 by the thermal pad 126 and the solder balls 128.

Figure 2A:
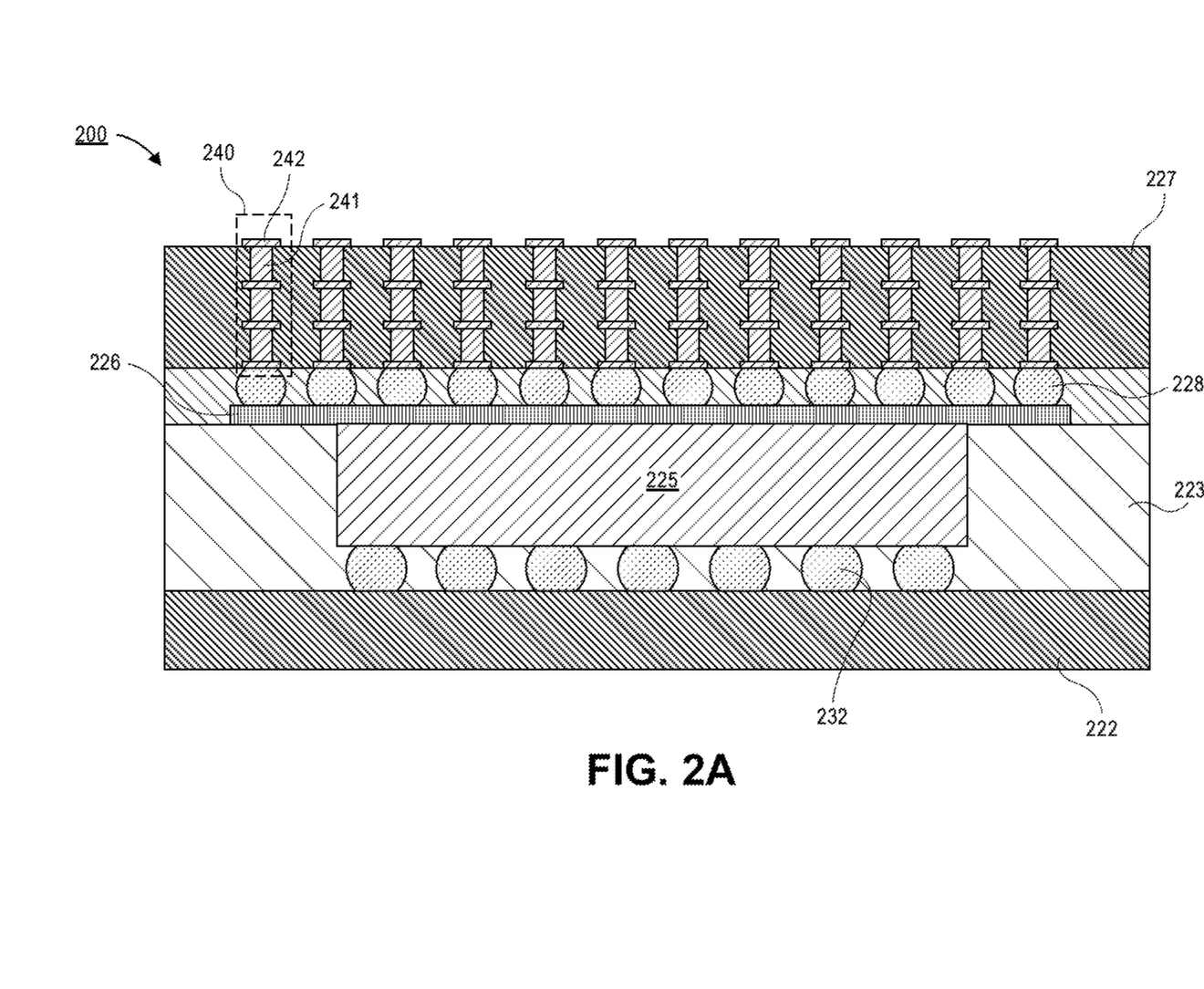
FIG. 2A is a cross-sectional illustration of the thermal pad with solder balls contacting thermal pathways through the interposer, in accordance with an embodiment.

Referring now to FIG. 2A, a cross-sectional illustration of a portion of an interposer PoP 200 is shown, in accordance with an embodiment. The interposer PoP 200 may be substantially similar to the interposer PoP 100 described above with respect to FIG. 1A, with the exception that more detail of the interposer 227 is shown. In an embodiment, the interposer 227 may comprise a plurality of thermal pathways 240. The thermal pathways 240 may pass through a thickness of the interposer 227. For example, the thermal pathways 240 may comprise pads 242 and vias 241 formed of a material with a high thermal conductivity. For example, the pads 242 and vias 241 may be copper or the like. In an embodiment, each of the thermal pathways 240 may contact one of the solder balls 228. In an embodiment, pads 242 may be formed on a surface of the interposer 227 facing away from the first die 225. As such, the thermal pathways 240 may provide improved heat dissipation through the interposer 227.

Figure 2B:
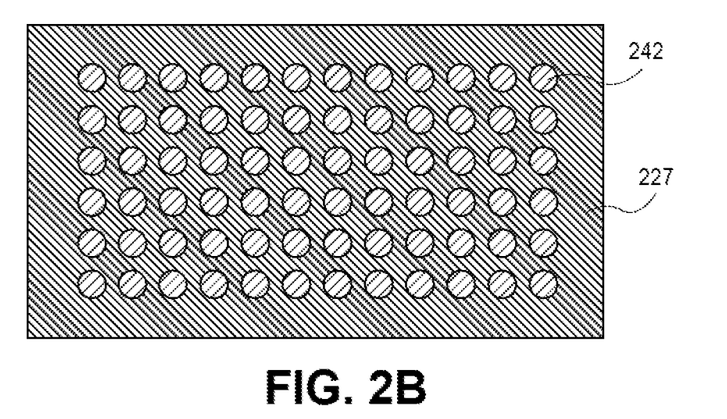
FIG. 2B is a plan view illustration of the interposer with a plurality of heat dissipation pads over the surface of the interposer, in accordance with an embodiment.
Figure 2C:
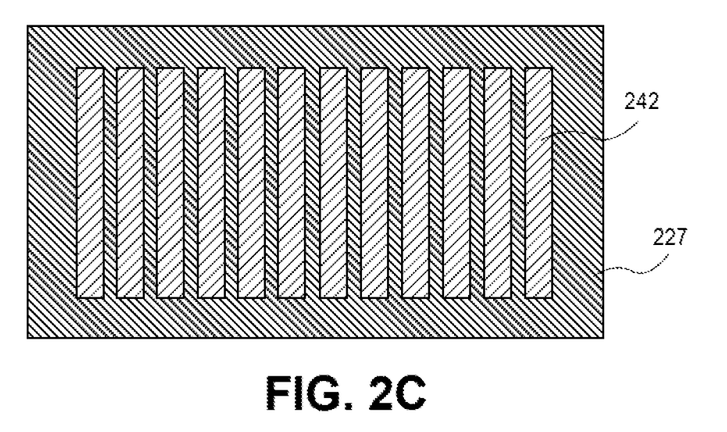
FIG. 2C is a plan view illustration of the interposer with a plurality of heat dissipation traces over the surface of the interposer, in accordance with an embodiment.
Figure 2D:
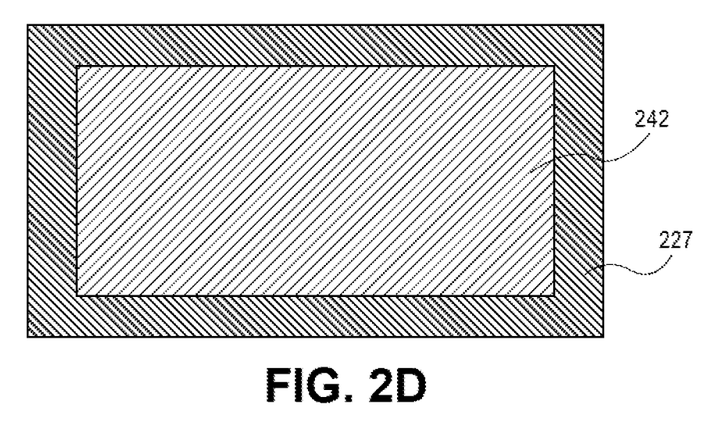
FIG. 2D is a plan view illustration of the interposer with a heat dissipation pad formed over the surface of the interposer, in accordance with an embodiment.

Referring now to FIGS. 2B-2D plan view illustrations of a portion of the interposer 227 are shown, in accordance with various embodiments. Referring now to FIG. 2B, the plurality of thermal pathways may each end with discrete heat dissipation pads 242. As shown in FIG. 2C, the thermal pathways may be coupled to a plurality of heat dissipation traces 242 formed over the surface of the interposer 227. In yet another embodiment, the thermal pathways may each be coupled to a single heat dissipation pad 242 formed over the surface of the interposer 227. While FIGS. 2B-2D provide examples of various heat dissipation pads and traces, it is to be appreciated that any shape or configuration of heat dissipation pads and/or traces may be used in embodiments disclosed herein.

Referring now to FIGS. 3A-3H, a series of cross-sectional illustrations illustrating a process flow for forming an interposer PoP assembly similar to the interposer PoP 100 described with respect to FIG. 1A is shown, in accordance with an embodiment.

Figure 3A:
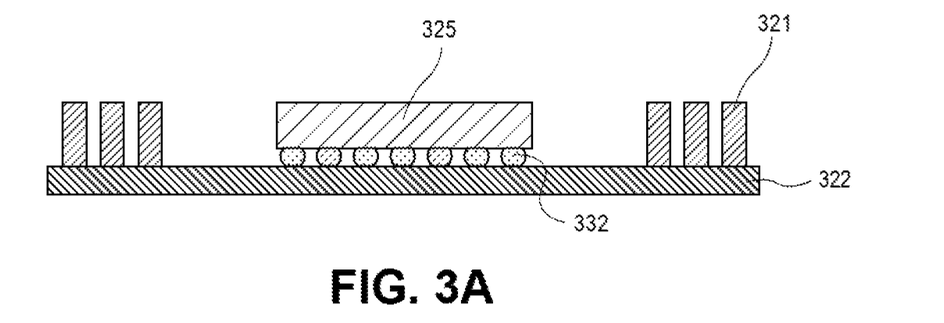
FIG. 3A is a cross-sectional illustration of a first die attached to a first package substrate, in accordance with an embodiment.

Referring now to FIG. 3A, a cross-sectional illustration of a first die 325 attached to a first package substrate 322 is shown, in accordance with an embodiment. In an embodiment, the first package substrate 322 may be any suitable package substrate that comprises one or more dielectric build-up layers. In some embodiments, the package substrate 322 may be a core-less substrate or a cored substrate. In embodiment, a plurality of conductive pillars 321 (e.g., copper pillars) may be formed over the first package substrate 322. However, it is to be appreciated that other through mold interconnects (e.g., solder balls, or the like) may be used in alternative embodiments. In an embodiment, the first die 325 may be flip-chip mounted to the first package substrate 322 with solder balls 332, or the like. Additional embodiments may also include any other FLI architecture to attach the first die 325 to the first package substrate 322.

Figure 3B:
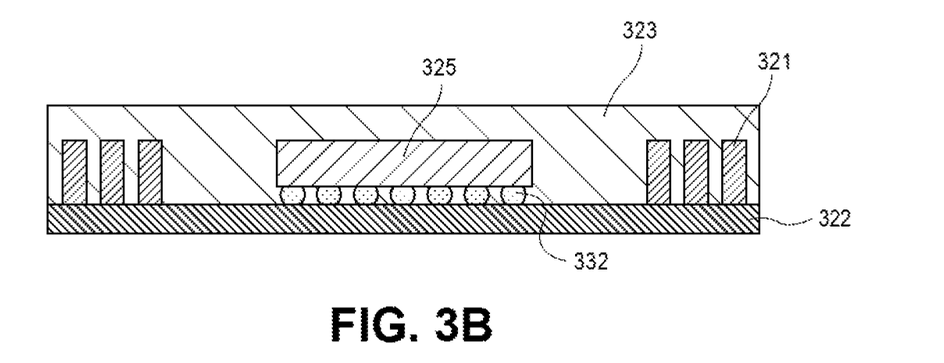
FIG. 3B is a cross-sectional illustration after a mold layer is disposed over the first die, in accordance with an embodiment.

Referring now to FIG. 3B, a cross-sectional illustration after a mold layer 323 is disposed over the first die 325 is shown, in accordance with an embodiment. In an embodiment, the mold layer 323 may be disposed with a molding process (e.g., compression molding) or a lamination process. In an embodiment, the mold layer 323 may have a top surface that is formed above the backside surface of the first die 325 and the conductive pillars 321.

Figure 3C:
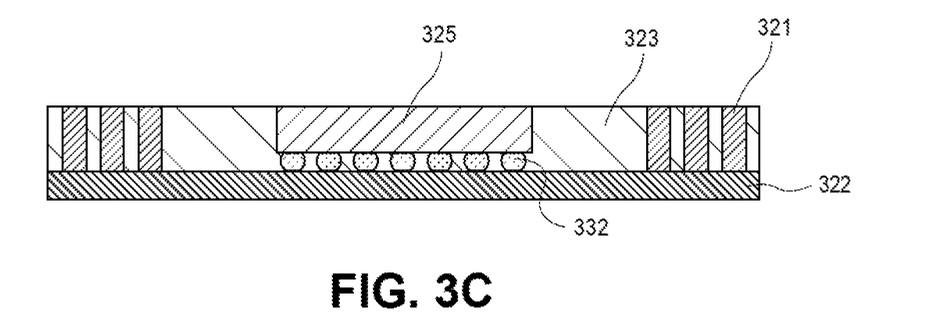
FIG. 3C is a cross-sectional illustration after the mold layer is recessed to expose a backside surface of the first die, in accordance with an embodiment.

Referring now to FIG. 3C, a cross-sectional illustration after the mold layer 323 is polished is shown, in accordance with an embodiment. In an embodiment, the mold layer 323 may be polished so that the backside surface of the first die 325 and the conductive pillars 321 and exposed. In an embodiment, the mold layer 323 may be planarized with a chemical mechanical planarization (CMP) process or the like.

Figure 3D:
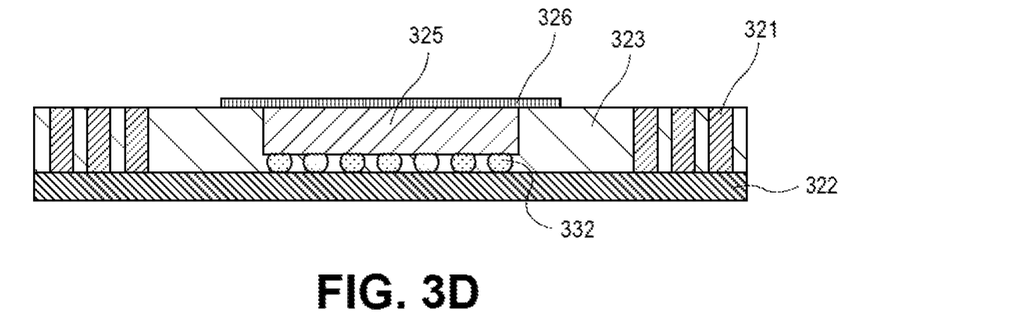
FIG. 3D is a cross-sectional illustration after a thermal pad is formed over the backside surface of the first die, in accordance with an embodiment.

Referring now to FIG. 3D, a cross-sectional illustration after a thermal interface pad 326 is formed over the backside surface of the first die is shown, in accordance with an embodiment. In an embodiment, the thermal interface pad 326 may be blanket deposited and portions removed (e.g., with a laser metal removal or other etching process) in areas where the thermal interface pad 326 is not desired. In an alternative embodiment, portions where the thermal interface pad 326 is not desired may be blocked off with a mask layer (not shown).

In an embodiment, the thermal interface pad 326 may be deposited with a sputtering process, or any other suitable metal deposition process. In an embodiment, the thermal interface pad 326 may comprise a high thermal conductivity material, such as a metallic material. For example, the thermal interface pad 326 may comprise copper, titanium, alloys of copper and titanium, or the like. In an embodiment, the thermal interface pad 326 may have a thickness that is 50 nm or greater, 25 μm or greater, 50 μm or greater, or 100 μm or greater.

Figure 3E:
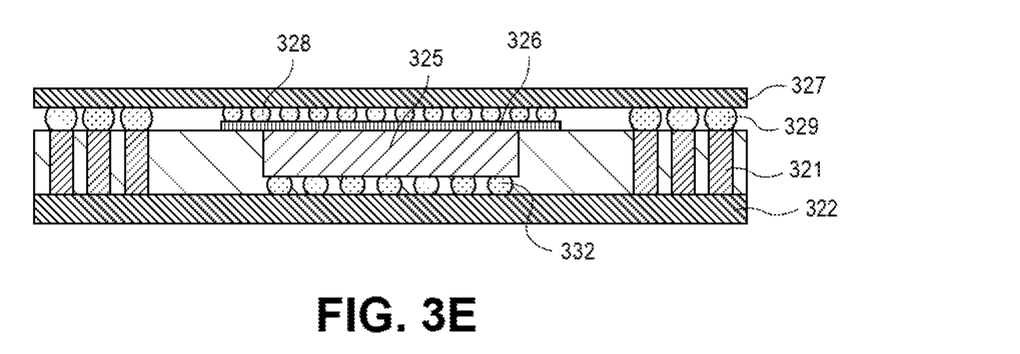
FIG. 3E is a cross-sectional illustration after an interposer is attached and solder balls thermally couple the interposer to the thermal pad, in accordance with an embodiment.

Referring now to FIG. 3E, a cross-sectional illustration after the interposer 327 is attached is shown, in accordance with an embodiment. In an embodiment, the interposer 327 may be attached with an array of solder balls. For example, solder balls 329 may electrically couple the interposer 327 to the through mold interconnects 321 and solder balls 328 may thermally couple the interposer 327 to the thermal interface pad 326. In an embodiment, the interposer 327 may be attached with a TCB process or with a thermal reflow process.

In an embodiment, the thermal interface pad 326 and the solder balls 328 may be electrically isolated from electrical circuitry of the package. That is, in some embodiments, thermal interface pad 326 and solder balls 328 may not be used to carry signals used by the active dies of the PoP assembly. In an additional embodiment, thermal interface pad 326 may be electrically coupled to a voltage level of the package. In a particular embodiment, the thermal interface pad 326 may be held at a voltage level of the backside of the first die 325.

Figure 3F:
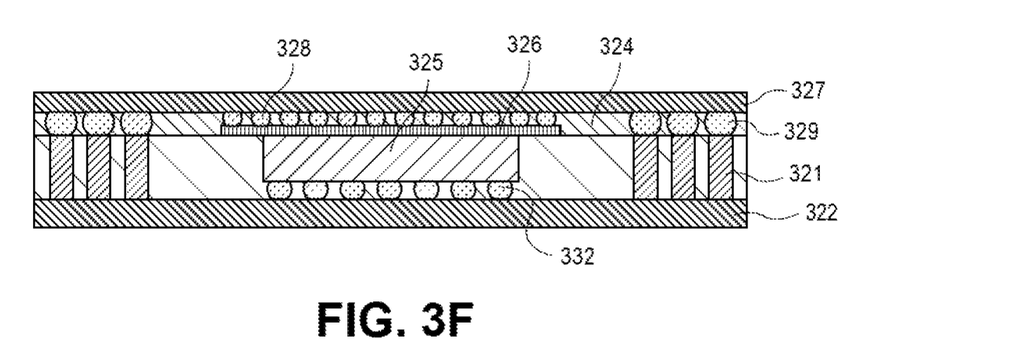
FIG. 3F is a cross-sectional illustration after an underfill material is formed around the solder balls, in accordance with an embodiment.

Referring now to FIG. 3F, a cross-sectional illustration after an underfill material 324 is formed around solder balls 328 is shown, in accordance with an embodiment. In an embodiment, the underfill material 324 may be a polymer material and may comprise filler particles, as is known in the art. In an embodiment, the underfill material 324 provides lateral support to the solder balls 328 and prevents extrusion of the solder balls 328 during subsequent processing operations, or during operation of the device. In an embodiment, the underfill material 324 may be disposed after the interposer 327 is attached. In alternative embodiments, the underfill material 324 may be applied simultaneously with the attachment of the interposer 327 (e.g., using pre-applied underfill, epoxy-flux, etc.).

Figure 3G:
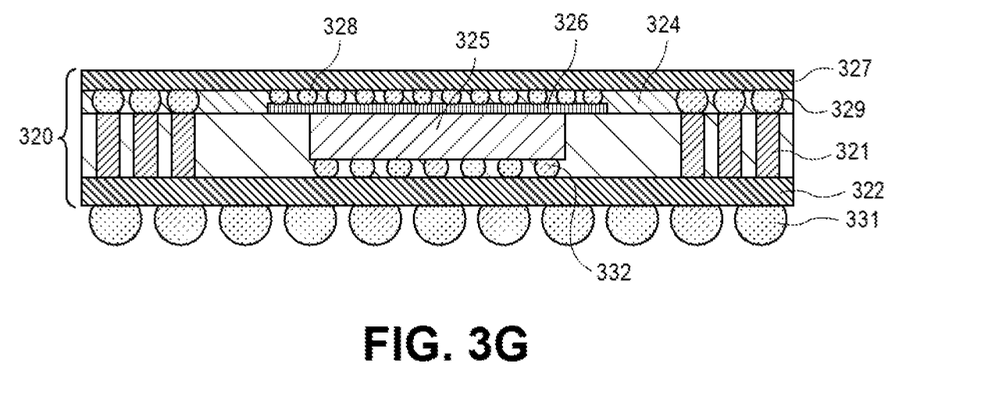
FIG. 3G is a cross-sectional illustration after second level interconnects are disposed on the first substrate, in accordance with an embodiment.

Referring now to FIG. 3G, a cross-sectional illustration after SLIs 331 are attached to the first package substrate 322 is shown, in accordance with an embodiment. In an embodiment, the SLIs 331 may include solder balls (e.g., BGA balls) or the like. In an embodiment, the first package substrate 322 may then be singulated into individual first packages 320 with each first package 320 comprising a first die 325.

Figure 3H:
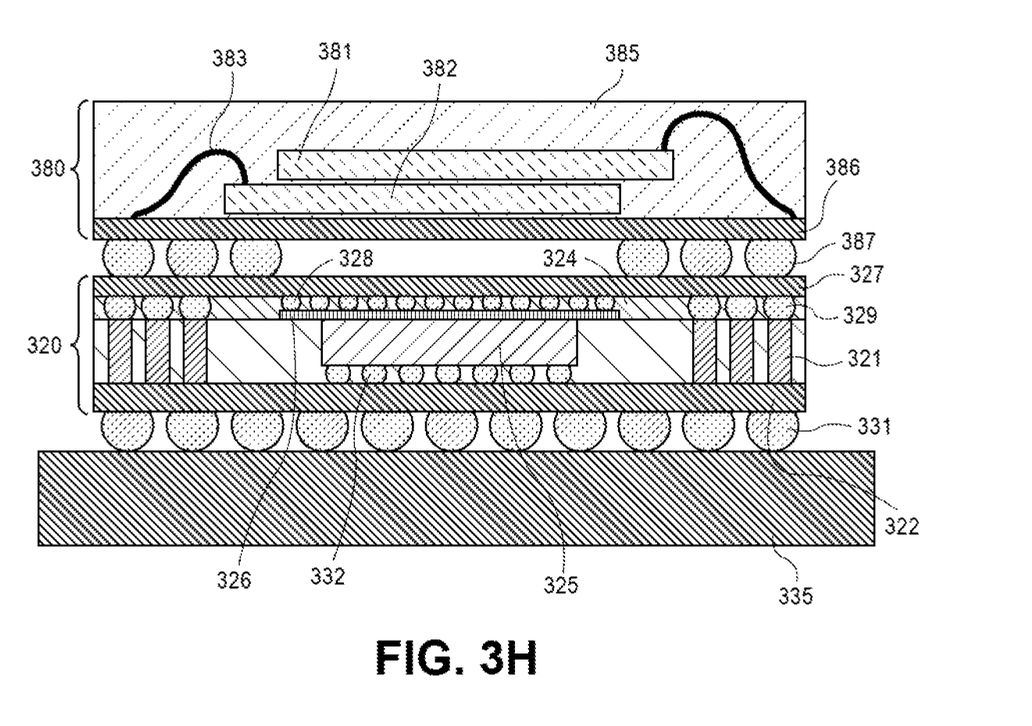
FIG. 3H is a cross-sectional illustration after a second package is attached over the first package and the PoP is attached to a printed circuit board (PCB).

Referring now to FIG. 3H, a cross-sectional illustration after a second package 380 is attached to the first package 320 is shown, in accordance with an embodiment. In an embodiment, the second package 380 may be attached over the first package 320 with solder balls 387 or the like. In an embodiment, the second package 380 may comprise a second package substrate 386 and a mold layer 385 that encapsulates one or more dies 381, 382. In the illustrated embodiment, the dies 381, 382 are electrically coupled to the second package substrate 386 with wire bonds 383. However, embodiments are not limited to such configurations and any interconnect architecture may be used. In an embodiment, the interposer PoP assembly comprising a first package 320 and a second package 380 may be attached to a printed circuit board (PCB) 335.

Figure 4:
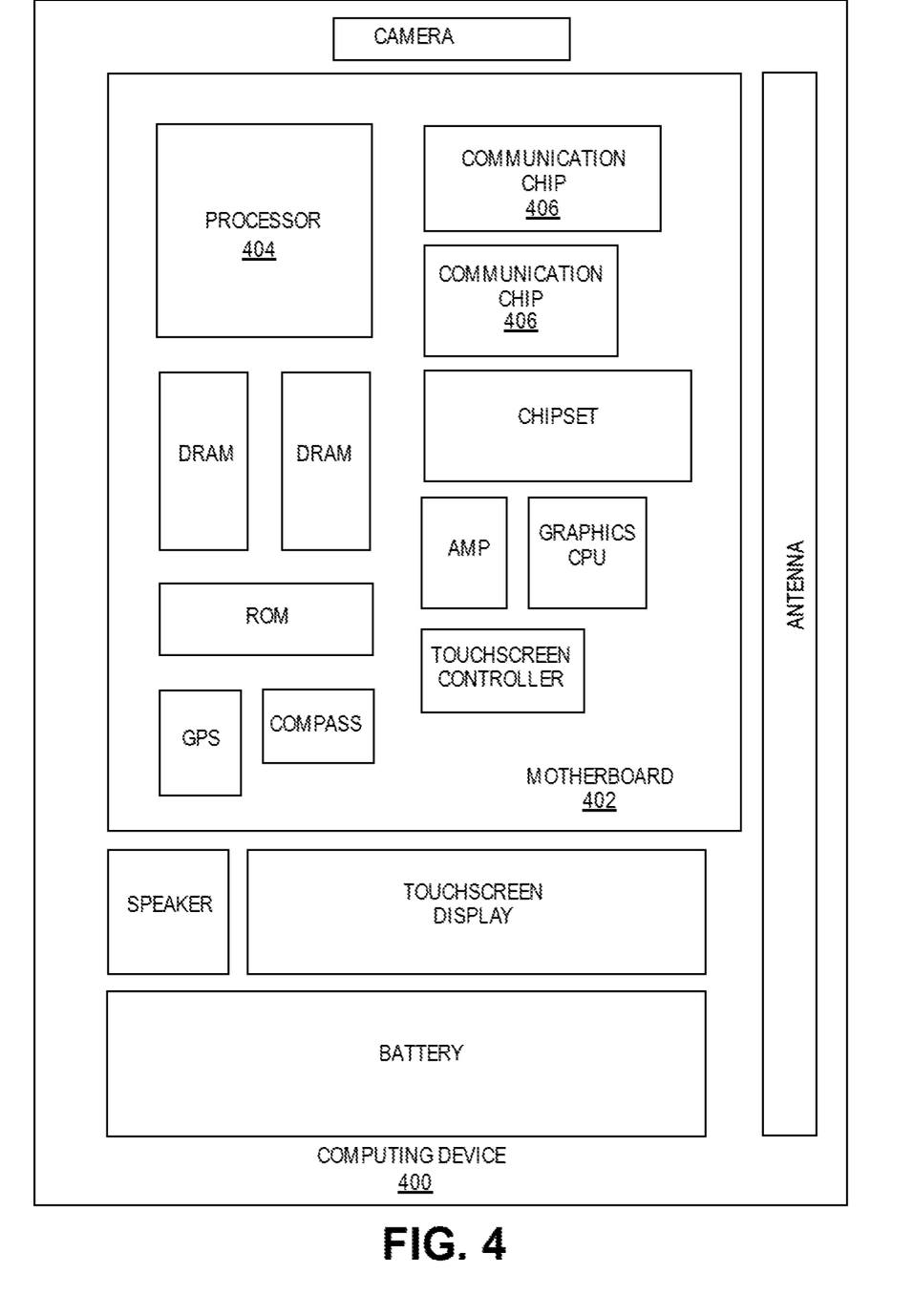
FIG. 4 is a schematic of a computing device built in accordance with an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be one die in an interposer PoP assembly that comprises a thermal interface pad, in accordance with embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be one die in an interposer PoP assembly that comprises a thermal interface pad, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a first package substrate, wherein the first package substrate comprises: a die embedded in a mold layer; a thermal interface pad over a surface of the die; and a plurality of solder balls over the thermal interface pad, wherein the thermal interface pad and the solder balls are electrically isolated from circuitry of the electronics package; and a second package substrate over the first package substrate.

Example 2: the electronics package of Example 1, wherein the plurality of solder balls are surrounded by an underfill layer.

Example 3: the electronics package of Example 1 or Example 2, wherein the plurality of solder balls thermally couple the die to an interposer.

Example 4: the electronics package of Examples 1-3, wherein the interposer comprises a plurality of thermal pathways, wherein each thermal pathway is contacted by one of the plurality of solder balls.

Example 5: the electronics package of Examples 1-4, wherein the thermal pathways comprise pads and vias through the interposer, wherein the pads and vias are electrically isolated from the circuitry of the electronics package.

Example 6: the electronics package of Examples 1-5, wherein the thermal pathways each comprise a pad over a surface of the interposer facing away from the die.

Example 7: the electronics package of Examples 1-6, wherein a plurality of heat dissipation traces over a surface of the interposer facing away from the die contact the thermal pathways.

Example 8: the electronics package of Examples 1-7, wherein a heat dissipation pad over a surface of the interposer facing away from the die contacts the thermal pathways.

Example 9: the electronics package of Examples 1-8, wherein the thermal interface pad is formed only over the surface of the die.

Example 10: the electronics package of Examples 1-9, wherein the thermal interface pad is formed over the surface of the die and a surface of the mold layer.

Example 11: the electronics package of Examples 1-10, wherein the first package comprises through mold interconnects through the mold layer.

Example 12: the electronics package of Examples 1-11, wherein the through mold interconnects are conductive pillars.

Example 13: the electronics package of Examples 1-12, wherein the second package substrate comprises a second die embedded in a mold layer.

Example 14: a computing system, comprising: a printed circuit board (PCB); and an electronics package attached to the PCB, wherein the electronics package comprises: a die embedded in a mold layer, wherein a surface of the die is coplanar with a surface of the mold layer; a thermal interface pad over the die and a portion of the mold layer; solder balls over the thermal interface pad; and an interposer over the mold layer, wherein the solder balls are in contact with the interposer.

Example 15: the computing system of Example 14, wherein the electronics package further comprises a second die embedded in a second mold layer, wherein the second die is electrically coupled to the interposer.

Example 16: the computing system of Example 14 or Example 15, wherein the first die is a processor and the second die is a memory component.

Example 17: the computing system of Examples 14-16, wherein the solder balls and the thermal interface pad are electrically isolated from circuitry of the computing system.

Example 18: the computing system of Examples 14-17, wherein the interposer comprises a plurality of thermal pathways, wherein each thermal pathway contacts one of the solder balls.

Example 19: the computing system of Examples 14-18, wherein the thermal pathways contact heat dissipation traces formed over a surface of the interposer facing away from the die.

Example 20: the computing system of Examples 14-19, wherein the thermal pathways contact a heat dissipation pad over a surface of the interposer facing away from the die.

Example 21: a method of forming an electronics package, comprising: mounting a die to a package substrate; disposing a mold layer over the die; recessing the mold layer to expose a surface of the die; disposing a thermal pad over the exposed surface of the die; disposing solder balls over the thermal pad; and attaching an interposer to the mold layer, wherein the solder balls contact the interposer, and wherein the solder balls are electrically isolated from circuitry of the electronics package.

Example 22: the method of Example 21, further comprising: disposing an underfill material around the solder balls.

Example 23: the method of Example 21 or Example 22, wherein the thermal pad is also disposed over portions of the mold layer.

Example 24: the method of Examples 21-23, further comprising: attaching a second package substrate to the interposer.

Example 25: the method of Examples 21-24, wherein a second die is disposed on the second package substrate, and wherein the first die is a processor, and wherein the second die is a memory component.

What is claimed is:

1. An electronics package assembly, comprising: a first package, wherein the first package comprises: a die embedded in a mold layer; a thermal interface pad on a surface of the die and on a surface of the mold layer; a plurality of solder balls over the thermal interface pad, wherein the thermal interface pad and the solder balls are electrically isolated from circuitry of the electronics package; and an underfill material laterally surrounding the thermal interface pad and the plurality of solder balls; a second package over the first package, wherein the plurality of solder balls thermally couple the die to an interposer, wherein the interposer comprises a plurality of thermal pathways, wherein each thermal pathway is contacted by one of the plurality of solder balls, wherein the thermal pathways comprise pads and vias through the interposer, and wherein the pads and vias are electrically isolated from the circuitry of the electronics package.

2. The electronics package assembly of claim 1, wherein the thermal pathways each comprise a pad over a surface of the interposer facing away from the die.

3. The electronics package assembly of claim 1, wherein a plurality of heat dissipation traces over a surface of the interposer facing away from the die contact the thermal pathways.

4. The electronics package assembly of claim 1, wherein a heat dissipation pad over a surface of the interposer facing away from the die contacts the thermal pathways.

5. The electronics package assembly of claim 1, wherein the thermal interface pad is formed only over the surface of the die.

6. The electronics package assembly of claim 1, wherein the thermal interface pad is formed over the surface of the die and a surface of the mold layer.

7. The electronics package assembly of claim 1, wherein the first package comprises through mold interconnects through the mold layer.

8. The electronics package assembly of claim 1, wherein the through mold interconnects are conductive pillars.

9. The electronics package assembly of claim 1, wherein the second package comprises a second die embedded in a mold layer.

10. A computing system, comprising: a printed circuit board (PCB); and an electronics package assembly attached to the PCB, wherein the electronics package assembly comprises: a die embedded in a mold layer, wherein a surface of the die is coplanar with a surface of the mold layer; a thermal interface pad on a surface of the die and on a surface of the mold layer; solder balls over the thermal interface pad; and an underfill material laterally surrounding the thermal interface pad and the plurality of solder balls; and an interposer over the mold layer, wherein the solder balls are in contact with the interposer, wherein the interposer comprises a plurality of thermal pathways, wherein each thermal pathway contacts one of the solder balls, and wherein the thermal pathways comprise heat dissipation traces or a heat dissipation pad formed over a surface of the interposer facing away from the die.

11. The computing system of claim 10, wherein the electronics package assembly further comprises a second die embedded in a second mold layer, wherein the second die is electrically coupled to the interposer.

12. The computing system of claim 11, wherein the first die is a processor and the second die is a memory component.

13. The computing system of claim 10, wherein the solder balls and the thermal interface pad are electrically isolated from circuitry of the computing system.

14. A method of forming an electronics package assembly, comprising:
　　mounting a die to a package;
　　disposing a mold layer over the die;
　　recessing the mold layer to expose a surface of the die;
　　disposing a thermal pad on the exposed surface of the die and on a surface of the mold layer;
　　disposing solder balls over the thermal pad;
　　forming an underfill material laterally surrounding the thermal interface pad and the plurality of solder balls; and
　　attaching an interposer to the mold layer, wherein the solder balls contact the interposer, and wherein the solder balls are electrically isolated from circuitry of the electronics package; and attaching a second package to the interposer.

15. The method of claim 14, wherein the thermal pad is also disposed over portions of the mold layer.

16. The method of claim 14, wherein a second die is disposed in the second package, and wherein the first die is a processor, and wherein the second die is a memory component.

\* \* \* \* \*